United States Patent
Bachmann et al.

(10) Patent No.: US 6,791,262 B2
(45) Date of Patent: Sep. 14, 2004

(54) ORGANIC ELECTROLUMINESCENT DISPLAY DEVICE COMPRISING A PROTECTIVE LAYER

(75) Inventors: Peter Klaus Bachmann, Wuerselen (DE); Volker Van Elsbergen, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 42 days.

(21) Appl. No.: 10/210,498

(22) Filed: Aug. 1, 2002

(65) Prior Publication Data

US 2003/0025448 A1 Feb. 6, 2003

(30) Foreign Application Priority Data

Aug. 6, 2001 (DE) .......................................... 101 37 712

(51) Int. Cl.$^7$ ............................................... H05B 33/00
(52) U.S. Cl. ........................... 313/506; 445/24; 313/512
(58) Field of Search ................................ 313/503–512; 445/24, 25

(56) References Cited

U.S. PATENT DOCUMENTS

| 4,213,074 | A | * | 7/1980 | Kawaguchi et al. | ......... 313/512 |
| 5,705,272 | A | * | 1/1998 | Taniguchi | ................... 428/408 |
| 6,020,426 | A | * | 2/2000 | Yamaguchi et al. | .......... 525/26 |
| 6,160,346 | A | | 12/2000 | Vleggaar et al. | ........... 313/512 |

* cited by examiner

Primary Examiner—Joseph Williams

(57) ABSTRACT

The invention relates to an organic electroluminescent display device comprising a front electrode member, a counterelectrode member, an organic electroluminescent member arranged between the front electrode member and the counterelectrode member, and a protective layer of an amorphous carbon modification, by means of which the organic electroluminescent display device is sealed in a gastight and moistureproof manner.

Figure 1:
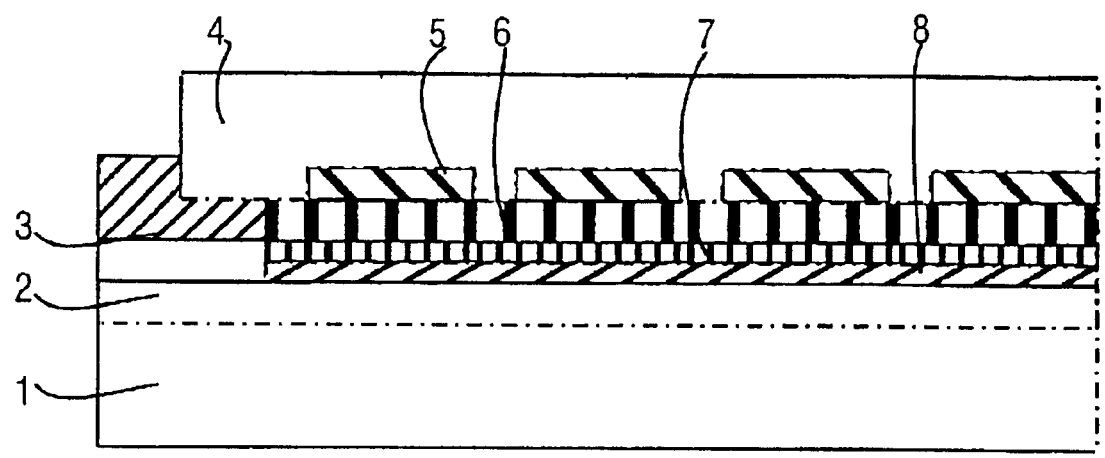

The invention also relates to a method of manufacturing such a display device.

6 Claims, 1 Drawing Sheet

ORGANIC ELECTROLUMINESCENT DISPLAY DEVICE COMPRISING A PROTECTIVE LAYER

The invention relates to an organic electroluminescent display device (OLED), which comprises a front electrode member, a counterelectrode member, an organic electroluminescent member arranged between the front electrode member and the counterelectrode member, and a protective layer of an inorganic barrier layer material.

LEDs in accordance with the state of the art customarily are inorganic semiconductor diodes, i.e. diodes whose emitter material is an inorganic semiconductor, for example ZnS, silicon, germanium or a III–V semiconductor such as InP, GaAs, GaAlAs, GaP or GaN with suitable dopants.

As a result of the availability of semiconductive, organic, conjugated polymers and the detection that they could suitably be used to manufacture light-emitting components, persons skilled in the art all over the world embarked upon the development of organic electroluminescent diodes and, based upon said organic electroluminescent diodes, the development of displays. Unlike inorganic LEDs, the application of which in displays having a comparatively high resolution is subject to certain conditions and involves high costs, organic electroluminescent diodes are attributed an enormous potential for small, easy-to-use displays.

Unlike liquid crystal displays, organic electroluminescent displays also have the advantage that they are luminescent and hence do not require an additional backlighting source.

As a result, said organic electroluminescent displays are employed in applications where luminescent display devices with a low supply voltage and low power dissipation are required. Said applications include, in particular, displays for mobile use such as cellular phones, organizers or applications in automobiles, i.e. from radios to navigation systems.

A serious problem however remains the service life of the organic electroluminescent display devices that is too short. In particular, it is a drawback that the luminance of the display devices decreases in a non-uniform manner over the surface during operation of the device. Also when the display device is not in operation, dark spots in the electroluminescent layer occur in the course of time. These dark spots are caused, and the expansion thereof enhanced, by moisture and detrimental gases from the surrounding atmosphere.

In order to seal organic electroluminescent display devices so as to protect them from moisture and detrimental gases, various arrangements comprising a gastight housing or moisture-absorbing means in the housing were proposed.

For example, U.S. Pat. No. 6,160,346 describes an electroluminescent device with an electroluminescent component that comprises an electroluminescent organic layer and two electrodes in contact with said electroluminescent layer, said electroluminescent component being enclosed in a housing composed of inorganic barrier-layer materials comprising a metal having a low melting point or an alloy having a low melting point below approximately 250° C. The housing seals the electroluminescent member in an airtight and waterproof manner.

A drawback of this electroluminescent device resides in that, in reaction to mechanical damage to the house, the device is subject to plastic deformation.

It is an object of the invention to provide an organic electroluminescent device comprising a mechanically and chemically stable protective layer that serves as a reliable diffusion barrier to moisture.

In accordance with the invention, this object is achieved by an organic electroluminescent display device comprising a front electrode member, a counterelectrode member, an organic electroluminescent member arranged between the front electrode member and the counterelectrode member, and a protective layer of an amorphous carbon modification.

This protective layer forms a coherent material layer that is used as a hermetic packing to protect the display device against environmental influences such as moisture and mechanical loads.

Said protective layer forms an excellent barrier against the penetration of water vapor and other contaminating or corrosive substances, and it is insensitive to mechanical deformation, crack formation and scratches.

It is preferred that the resistivity of the protective layer $\rho \geq 10^6$ $\Omega$cm.

It is also preferred that the layer thickness of the protective layer $d \leq 5$ $\mu$m. In some applications, layer thicknesses of 50 nm may already provide sufficient protection.

The invention relates to a method of manufacturing an organic electroluminescent display device comprising a front electrode member, a counterelectrode member, an organic electroluminescent member arranged between the front electrode member and the counterelectrode member, and a protective layer of an amorphous carbon modification, in which the protective layer is deposited from the gas phase.

In accordance with a preferred embodiment of the invention, the protective layer is deposited by means of a microwave-plasma-CVD-process.

It is particularly preferred that the operating point of the deposition from the gas phase lies in the kinetically controlled range.

These and other aspects of the invention are apparent from and will be elucidated with reference to the embodiments described hereinafter.

In the drawing:

FIG. 1 diagrammatically shows the structure of an organic electroluminescent display device in accordance with the invention.

An organic electroluminescent display device in accordance with the invention comprises a front electrode member, a counterelectrode member, an organic electroluminescent member arranged between the front electrode member and the counterelectrode member, and a protective layer of an amorphous carbon modification.

Such a display device typically comprises an arrangement of superposed and partly juxtaposed individual layers. To form such an arrangement of layers use can be made of all layer structures and materials known to persons skilled in the art. Customarily, the OLEDs comprise an electroluminescent layer arranged between a positive electrode as the front electrode and a negative electrode as the counterelectrode, one or both electrodes possibly being transparent and/or segmented. In addition, one or more electron-injection layers and/or electron-transport layers may be arranged between the electroluminescent layer and the positive electrode. Likewise, one or more hole-injection layers and/or hole-transport layers may be arranged between the electroluminescent layer and the negative electrode.

FIG. 1 shows an embodiment of the organic electroluminescent display device comprising a protective layer of amorphous carbon.

Said organic electroluminescent display device comprises a first electrode 8 of ITO with contact terminals 3, an electroluminescent layer 7 of PDOT, a second electroluminescent layer 6 of PPV and a second electrode of Al 5. The organic electroluminescent display device is additionally covered with a protective layer of amorphous carbon 4. The display device may be entirely covered with the protective layer of an amorphous carbon modification. Preferably, display device is provided on an optically transparent substrate 1 by means of an adhesive layer of $SiO_2$ 2.

This arrangement of layers may be provided on a substrate of glass, quartz, ceramic, synthetic resin or a transparent flexible plastic film. Suitable synthetic resins are, for example, polyimides, polyethyleneterephtalate and polytetrafluoroethylene.

The electroluminescent layer is arranged between two electrode layers.

The negative electrode supplies electrons which combine with the holes in the organic electroluminescent layer originating from the positive electrode so as to form excitons, and emit photons during the recombination process.

At least one of the electrode layers should be transparent or at least translucent. Customarily, the positive electrode is made of a non-stoichiometric or doped tin oxide, for example ITO, or of a metal with a high work function, for example gold or silver. These electrode materials can be readily used to form transparent layers. Particularly ITO can suitably be used for this purpose as it is highly electroconductive and transparent.

Alternatively, use can be made of a layer of a conductive polyaniline or poly-3,4-ethylenedioxythiophene, whether or not in combination with an ITO layer as the transparent positive electrode.

The negative electrode, which injects electrons into the organic electroluminescent layer, should have a low work function. Materials that can suitably be used for the negative electrode are, for example, indium, aluminum, calcium, barium or magnesium. If the negative electrode is made from reactive barium, it is recommendable to cover this electrode layer with a further protective layer of an epoxy resin or an inert metal. These layers have the advantage that their reflectivity is lower than that of metal layers.

It has been found that aromatic, conjugated ladder polymers of the poly(paraphenylene)-type (LPPP), which chemically resemble oligophenylene or polyphenylene, are particularly suitable as organic electroluminescent components for use in organic LEDs. LPPPs demonstrate a continuous chain of conjugated double bonds. Particularly suitable are, for example, soluble polyphenylene ethylene vinylene and soluble polythiophene, in particular polyphenylenevinylene, which are further substituted at the phenyl ring, in the $2^{nd}$ and $5^{th}$ position, with alkyl or alkoxy residues. Such polymers are readily processable and yield layers having an amorphous structure. Examples of suitable polyphenylene vinyls are poly(2-methyl-5-(n-dodecyl)-p-phenylenevinylene, poly(2-methyl-5-(3,5,dimethyloctyl)-p-phenylenevinylene, poly(2-methyl-5-(4,6,6,-trimethylheptyl)-p-phenylenevinylene, poly(2-methoxy-5-dodecyloxy-p-phenylenevinylene and poly(2-methoxy-5-(ethylhexyloxy)-phenylenevinylene (MEH-PPV).

Display devices comprising two different electroluminescent layers clearly outperform organic, electroluminescent display devices having only one electroluminescent layer. One layer effectively transports holes, for example PPV, and one layer effectively transports electrons, for example oxadiazole. This enables holes and electrons to recombine more readily.

Polyethylenedioxythiophene PEDOT and polyethylenedioxythiophene-polystyrenesulphonate PEDOT-SS are particularly advantageous for transporting positive charge carriers. For transporting positive charge carriers use is very advantageously also made of 4,4',4"-tris [N-(1-naphtyl)-N-phenyl-amino]-triphenylamine in combination with hydroxyquinoline aluminum-III-salt Alq3 as the emission and electron transport material.

Such organic electroluminescent display devices are known per se.

In accordance with the invention, the display device comprises a protective layer of an amorphous carbon modification. Said protective layer adheres well to the metals or alloys of the electrodes and levels the comparatively fissured surface of the organic electroluminescent display device to a smooth, impervious surface.

Amorphously modified carbon is a carbon material comprising an amorphous, nanocrystalline or microcrystalline carbon network. Such carbon modifications are also referred to as a-C, a-C:H, t-aC or, on account of the high mechanical hardness, as diamond-like carbon or glassy carbon.

These amorphous modifications of carbon have particular properties that can be attributed to the simultaneous occurrence of tetrahedral bonding with $sp^3$ hybridization and trigonal bonding with $sp^2$ hybridization in their structure.

The protective layer of an amorphous modification of carbon can be manufactured by deposition from the gas phase, i.e. by a PVD process such as sputtering and evaporation, and in particular by a CVD process. Suitable CVD processes include plasma CVD processes, ECR-plasma-CVD processes, DC-plasma-jet-CVD processes, filtered cathode arc deposition processes, cascaded arc-CVD-processes, RF-plasma-CVD processes and microwave-plasma-CVD processes.

Use is preferably made of the microwave-plasma-CVD process as said process leads to a very high conformity of the deposition. In the case of a deposition process with ideal conformity, the rate at which the layer is formed at vertical is equal to that at horizontal surfaces, and a uniform step coverage is attained. The conformity of the deposition is favorably influenced if the operating point of the deposition from the gas phase lies in the kinetically controlled range. High temperatures also have a favorable effect on the conformity of the deposition, however the deposition temperature preferably is below 250° C. As said temperature is insufficient for pyrolysis, the well gass is additionally excited by a high-frequency gas discharge and decomposed, so that it adheres to the surface of the organic electroluminescent display device.

The surface to be coated is preferably moved with respect to the carbon source during the coating operation.

An appropriate reaction control enables layers of amorphous carbon having a high electrical resistance to be manufactured during the deposition from the gas phase. Layers having resistance values up to $10^{13}\Omega$ are possible. When the protective layer is deposited from the gas phase, said protective layer can be formed from different well gases. Gaseous hydrocarbons are preferred, for example alkanes, i.e. saturated aliphatic hydrocarbons such as methane, ethane and propane. Use is preferably made of methane. In addition, use can also be made of alkenes, i.e. unsaturated hydrocarbons such as ethene and propene, for example acetylene, cycloalkane, i.e. saturated cyclic hydrocarbons such as cyclohexane and, in the vapor state, aromatic hydrocarbons such as benzol or benzol derivatives. The hydrocarbons of the type mentioned above can be used individually or as a mixture. In addition, inert gases such as helium or argon may be added to the hydrocarbons.

The surface to be coated of the organic electroluminescent display device is advantageously shielded during the coating process by measures such as beam control, filters etc. against the influence of UV radiation and ion bombardment taking place during the coating process.

The display device in accordance with the invention may further comprise optical filter members that suppress the reflections within the display device. These reflections develop, on the one hand, at the interfaces between the layers of the display device, which layers have different refractive indices, and, on the other hand, at the metal cathode which acts like a metal mirror.

To suppress light reflection at the cathode, said cathode may be coated with an electroconductive, light-absorbing layer.

The display device in accordance with the invention may additionally comprise devices that influence the electro-optical properties, such as UV filters, anti-reflex coatings, devices known as microcavities, such as color-conversion and color-correction filters.

The display device may be embodied so as to be, for example, a segmented display or a matrix display with separately addressed pixels. Only the shape of the electrodes enables the individual pixels to be readily manufactured, since the polymeric material of the organic electroluminescent component has a high resistance. Consequently, the diffusion of the charge carriers is minimal, so that crosstalk between the pixels is precluded.

A complete display screen is obtained by adding an electronics section to the display device.

What is claimed is:

1. An organic electroluminescent display device comprising a front electrode member, a counterelectrode member, an organic electroluminescent member arranged between the front electrode member and the counterelectrode member, and a protective layer of an amorphous carbon modification.

2. An organic electroluminescent display device as claimed in claim 1, characterized in that the resistivity of the protective layer $\rho \geq 10^6$ $\Omega$cm.

3. An organic electroluminescent display device as claimed in claim 1, characterized in that the layer thickness of the protective layer $d \leq 5$ $\mu$m.

4. A method of manufacturing an organic electroluminescent display device comprising a front electrode member, a counterelectrode member, an organic electroluminescent member arranged between the front electrode member and the counterelectrode member, and a protective layer of an amorphous carbon modification, in which the protective layer is deposited from the gas phase.

5. A method of manufacturing an organic electroluminescent display device as claimed in claim 4, characterized in that the protective layer is deposited by means of a microwave-plasma-CVD-process.

6. A method of manufacturing an organic electroluminescent display device as claimed in claim 4, characterized in that the operating point of the deposition from the gas phase lies in the kinetically controlled range.

* * * * *